United States Patent
Abe et al.

(10) Patent No.: US 6,767,812 B2
(45) Date of Patent: Jul. 27, 2004

(54) METHOD OF FORMING CVD TITANIUM FILM

(75) Inventors: Kazuhide Abe, Tokyo (JP); Yusuke Harada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 191 days.

(21) Appl. No.: 09/984,383

(22) Filed: Oct. 30, 2001

(65) Prior Publication Data

US 2002/0192374 A1 Dec. 19, 2002

(30) Foreign Application Priority Data

Jun. 14, 2001 (JP) ........................................ 2001-180039

(51) Int. Cl.$^7$ ........................ H01L 21/28; H01L 21/44
(52) U.S. Cl. ...................................... 438/581; 438/583
(58) Field of Search ................................. 438/581, 583, 438/630, 651, 655, 664, 721, 755, FOR 338, FOR 360, 618, 582, 684, 649, 656; 257/377, 388, 382–384, 454, 456, 486, 576, 768, 770, E21.006, E21.199, E29.56, E21.03, E21.593

(56) References Cited

U.S. PATENT DOCUMENTS

| | | | | |
|---|---|---|---|---|
| 5,104,694 A | * | 4/1992 | Saito et al. ............ | 427/255.18 |
| 5,268,590 A | * | 12/1993 | Pfiester et al. .............. | 257/764 |
| 5,352,631 A | * | 10/1994 | Sitaram et al. ............. | 438/300 |
| 5,550,084 A | * | 8/1996 | Anjum et al. ............... | 438/664 |
| 5,633,036 A | | 5/1997 | Seebauer et al. | |
| 5,780,362 A | * | 7/1998 | Wang et al. ................ | 438/683 |
| 5,874,342 A | * | 2/1999 | Tsai et al. ................... | 438/301 |
| 5,891,234 A | * | 4/1999 | Koyanagi et al. ...... | 106/287.16 |
| 5,902,129 A | * | 5/1999 | Yoshikawa et al. ......... | 438/592 |
| 5,904,517 A | * | 5/1999 | Gardner et al. ............ | 438/197 |
| 5,904,564 A | * | 5/1999 | Park .......................... | 438/683 |
| 5,926,737 A | | 7/1999 | Ameen et al. | |
| 5,972,790 A | | 10/1999 | Arena et al. | |
| 6,136,705 A | * | 10/2000 | Blair .......................... | 438/682 |
| 6,251,780 B1 | * | 6/2001 | Sohn et al. ................. | 438/683 |
| 6,274,511 B1 | * | 8/2001 | Wieczorek et al. ......... | 438/766 |
| 6,410,429 B1 | * | 6/2002 | Ho et al. .................... | 438/655 |
| 6,433,388 B2 | * | 8/2002 | Kanamori ................... | 257/347 |
| 6,437,445 B1 | * | 8/2002 | Lee et al. ................... | 257/768 |

OTHER PUBLICATIONS

T. Taguwa et al., "Silicide Forming during Titanium Chemical Vapor Deposition," Jun. 10–12, 1997 VMIC Conference, 1997 ISMIC—107/97/0255(c), pp. 255–257.

* cited by examiner

Primary Examiner—George Fourson
Assistant Examiner—Brook Kebede
(74) Attorney, Agent, or Firm—Volentine Francos, PLLC

(57) ABSTRACT

Before deposition of a CVD titanium film on a cobalt silicide layer, an element which reacts with titanium is provided in the cobalt silicide layer in advance. Thereafter, the CVD titanium film is deposited on the cobalt silicide using a titanium tetrachloride gas.

25 Claims, 3 Drawing Sheets

METHOD OF FORMING CVD TITANIUM FILM

BACKGROUND OF THE INVENTION

1. Field of the Invention

The present invention relates to a method of forming a CVD titanium film, which is suitable for use in a semiconductor device, and particularly to a method of depositing a titanium film on a cobalt silicide film.

2. Description of the Related Art

With micro-fabrication of semiconductor elements, contact holes are reduced in diameter and contact hole portions increase in aspect ratio. With a view toward forming a desired contact or adhesive layer (e.g., titanium nitride TiN) at a sidewall portion of the scaled-down contact hole or at its bottom by a sputtering method, the deposited thickness of adhesive layer must be increased. Since an increase in the thickness of a sputtering film having an overhung shape narrows the diameter of a contact entrance as shown in FIG. 1, the subsequent embedding of a tungsten film (W) in each contact hole by a chemical vapor deposition (CVD) method becomes difficult. Therefore, a CVD method capable of obtaining excellent coverage has been expected as an alternative to the sputtering method.

In order to form a titanium nitride film by the CVD method, organic or inorganic titanium tetrachloride ($TiCl_4$) such as tetrakisdimethylamino titanium (TDMAT), tetrakisdiethylamino titanium (TDEAT) or the like is used as a raw material gas. However, the organic raw material is high in cost and poor in coverage too under present circumstances. Since carbon (C) is contained in the film as an impurity, there is the demerit of increasing specific resistivity up to ten times that of the sputtering film. Therefore, titanium tetrachloride is generally used in plenty as the raw material gas. Since the deposition of titanium by the organic raw material gas is difficult, titanium tetrachloride is used even for the formation of a titanium (Ti) film.

FIG. 2 shows the dependence of the deposited thickness of titanium on silicon (Si), a silicon oxide film ($SiO_2$) and a cobalt silicide ($CoSi_2$) layer on deposition time. The present drawing indicates that the deposition of titanium on the cobalt silicide ($CoSi_2$) layer is slow as compared with deposition on the other underlying beds. This phenomenon results from the mechanism of deposition or growth of the CVD titanium film. When the underlying bed is silicon, the deposited titanium reacts with silicon to form a titanium silicide ($TiSi_x$) layer. The resultant titanium silicide layer is etched by a titanium tetrachloride gas.

However, the titanium deposited on each of the silicon oxide film and the cobalt silicide ($CoSi_2$) layer undergoes etching of the titanium tetrachloride gas, and the finally-deposited film-thickness of titanium is determined according to the balance between deposition and etching. The titanium on the silicon oxide film and the cobalt silicide ($CoSi_2$) layer are different in titanium deposition rate because of the difference in etching rate due to the difference in film quality of titanium. Thus, the problem is to control or restrain the etching of titanium deposited on the cobalt silicide ($CoSi_2$) layer.

SUMMARY OF THE INVENTION

The present invention aims to cause an element that reacts with titanium to be contained in the surface of cobalt silicide ($CoSi_2$) or in the cobalt silicide ($CoSi_2$) to thereby form a titanium compound during CVD titanium deposition and realize the deposition of a CVD titanium film at a high deposition rate, which has controlled etching using a titanium tetrachloride gas.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

A preferred embodiment of the present invention will hereinafter be described in detail with reference to the accompanying drawings.

FIG. 3 is a process diagram showing the formation of a titanium film on cobalt silicide, according to an embodiment of the present invention.

Figure 1:
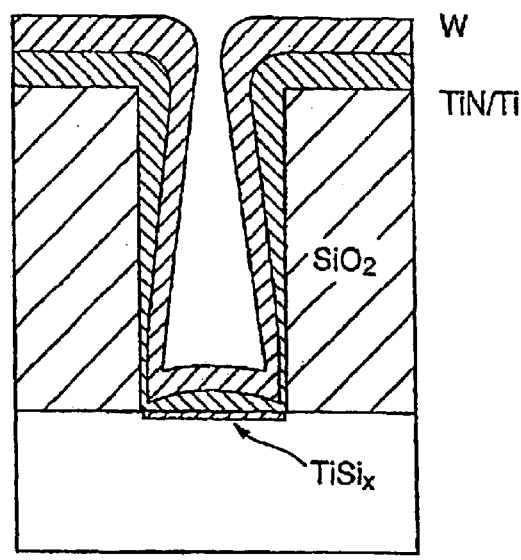
FIG. 1 is a diagram of a contact hole portion for describing a problem involved in a prior art.
Figure 2:
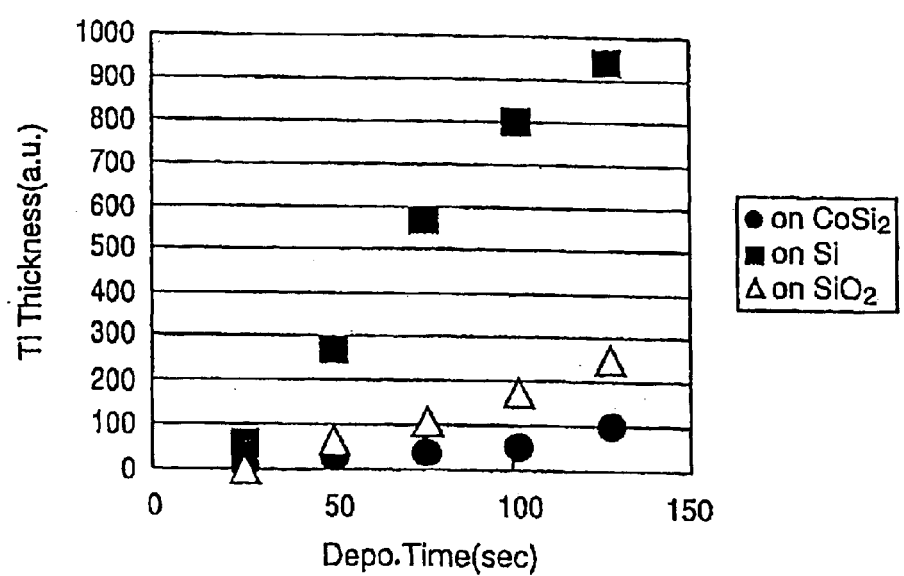
FIG. 2 is a graph showing a deposition rate of a titanium film employed in the prior art.
Figure 3A:
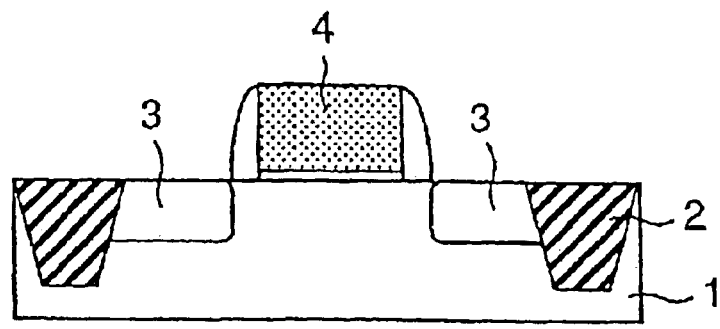
FIGS. 3A through 3G are respectively process diagrams illustrating a method of forming a titanium film on cobalt silicide, according to an embodiment of the present invention.
Figure 3B:
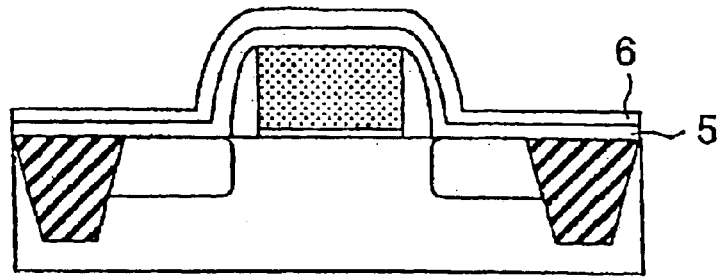
Figure 3C:
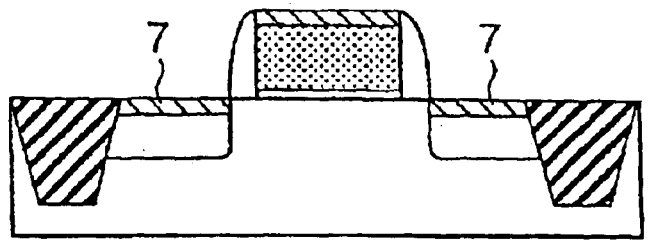
Figure 3D:
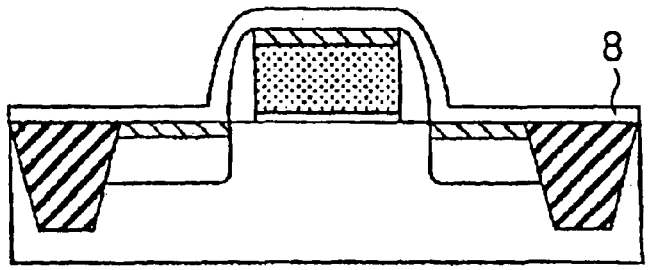
Figure 3E:
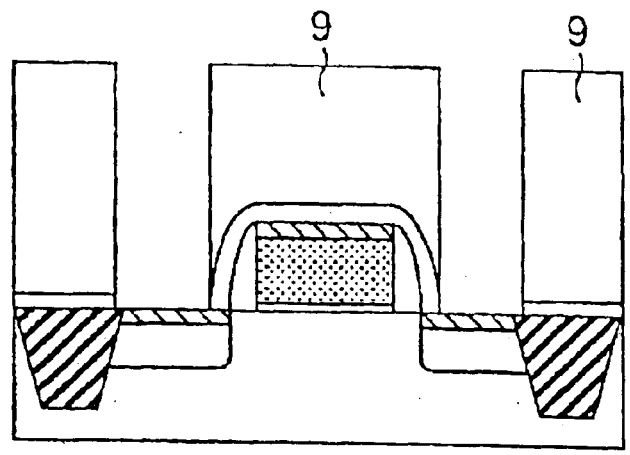
Figure 3F:
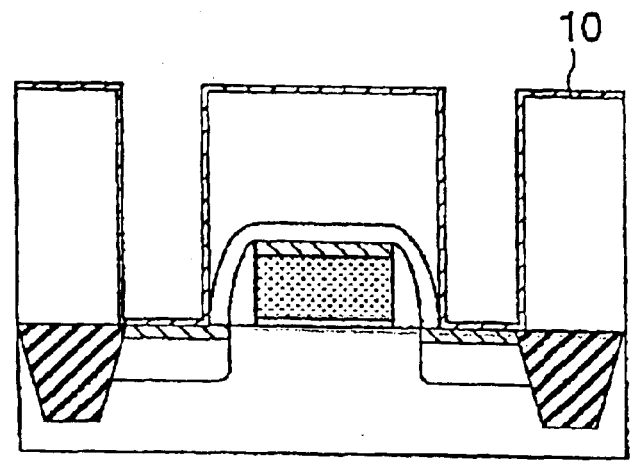
Figure 3G:
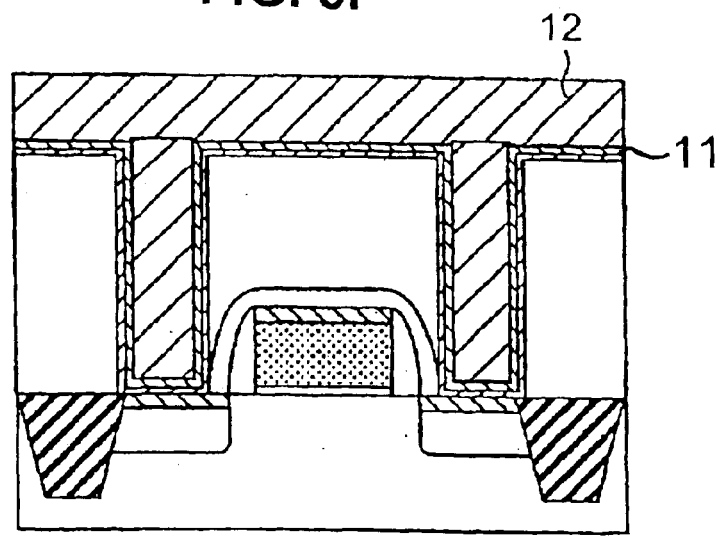

After a device isolation region 2 has been formed in a semiconductor substrate 1, a source and a drain 3 and a gate electrode 4 are formed, followed by cleaning with a hydrofluoric acid (HF) solution to remove a native oxide film in an active region (see FIG. 3A). Next, a cobalt film 5 is deposited by using a cobalt target, followed by deposition of a titanium nitride film 6 used as a cap layer without being exposed in the atmosphere in succession by a sputtering method (see FIG. 3B). Subsequently, heat treatment is done in a nitrogen ($N_2$) atmosphere at a temperature of 550° C. for 30 seconds, whereby a high-resistance cobalt silicide (CoSi) layer is formed. After its heat treatment, unreacted cobalt and a titanium nitride cap layer are removed with mixed chemicals of sulfuric acid ($H_2SO_4$) and hydrogen peroxide ($H_2O_2$).

Next, heat treatment is carried out at a temperature of 850° C. for 30 seconds in the nitrogen atmosphere to form a low-resistance cobalt silicide ($CoSi_2$) layer 7. Thereafter, an insulating film 8 (e.g., a silicon oxide film), which serves as a mask for implantation, is deposited, and boron (B) is distributed into cobalt silicide ($CoSi_2$) by $BF_2$ implantation (see FIG. 3D). An intermediate insulating film 9 (e.g., silicon oxide film, BPSG) is deposited, and thereafter contact holes are defined therein according to layouts corresponding to patterns to be formed, by the known lithography technology and etching technology (see FIG. 3E).

After the definition of the contact holes therein, a cobalt silicide ($CoSi_2$) surface layer is etched by sputtering etching using argon (Ar). Afterwards, CVD titanium nitride/titanium used as an adhesive layer is deposited. Upon deposition of the adhesive layer, a wafer is introduced into a pressure-reduced titanium CVD chamber, where the temperature thereof is increased up to a deposition temperature of 650° C. Next, a raw material gas (e.g., titanium tetrachloride, hydrogen ($H_2$) or the like) is introduced into the chamber to produce a CVD titanium film 10 by a plasma method. Boron and titanium on the cobalt silicide ($CoSi_2$) surface layer react with each other upon deposition of the CVD titanium film to thereby form a TiBx compound layer (see FIG. 3F).

It is understood that since TiB and $TiB_2$ corresponding to TiBx compounds are respectively stable compounds as compared with −170.6KJ/mol and −324.4KJ/mol and −144.3KJ/mol and −152.1KJ/mol of TiSi and $TiSi_2$ equivalent to titanium silicide ($TiS_x$) compounds as viewed from the viewpoint of Gibbs free energy (298K at room temperature), they are easily formed during the deposition of the CVD titanium film. Accordingly, the formation of the stable titanium compounds makes it possible to control etching using the titanium tetrachloride gas.

Next, a nitride gas (e.g., ammonia, nitrogen or the like) is introduced while vacuum is being kept as it is or within the same chamber. While the nitride gas is introduced in this way, the pressure in the chamber is controlled to such pressure that the nitride gas is not excessively diffused into the previously deposited titanium film, i.e., pressure for nitriding the surface of the titanium film. Thereafter, RF is applied to perform plasma processing. Next, the wafer is transferred to another chamber while the vacuum is being kept as it is. Afterwards, the material gas (e.g., titanium tetrachloride, ammonia or the like) is introduced into the chamber to produce or deposit a titanium nitride film 11 at a deposition temperature of 680° C. After its deposition, annealing is done within the titanium nitride CVD chamber with the ammonia gas. Thereafter a CVD tungsten film 12 is deposited to bury the contact holes (see FIG. 3G).

Depositing cobalt through the use of a target obtained by adding boron to cobalt makes it possible to easily contain boron in the cobalt silicide ($CoSi_2$). Since the boron is contained in the cobalt silicide ($CoSi_2$) layer as described above, the TiBx compound used to control the etching using the titanium tetrachloride gas can be formed upon deposition of the CVD titanium film. Further, a TiBx layer, which serves so as to reduce contact resistance between the CVD titanium nitride layer and the cobalt silicide ($CoSi_2$) layer, can be deposited at a high deposition rate.

While boron has been introduced as the impurity in the present embodiment, silicon is introduced into the cobalt silicide ($CoSi_2$) layer by an ion implantation method or through the use of the target added with silicon, thereby making it possible to achieve an improvement in deposition rate in a manner similar to boron. This is because the etching of the titanium film by the titanium tetrachloride gas is controlled owing to the formation of the TiSix compound.

According to the present invention as described above, since the etching using the titanium tetrachloride gas is controlled upon deposition of the CVD titanium film using the titanium tetrachloride gas on the cobalt silicide ($CoSi_2$) layer, it is possible to realize the deposition of the CVD titanium film having a higher deposition rate.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming a CVD titanium film, comprising:
   providing a silicon substrate;
   forming a cobalt silicide layer on the silicon substrate;
   introducing an element which reacts with titanium into the cobalt silicide layer; and
   forming a titanium film on the cobalt silicide layer while titanium produced by a CVD method using a titanium tetrachloride gas is allowed to react with the element in the cobalt silicide layer.

2. The method according to claim 1, wherein the element is boron.

3. The method according to claim 2, wherein the boron reacts with titanium to form TiBx.

4. The method according to claim 1, wherein the element is silicon.

5. The method according to claim 4, wherein the silicon reacts with titanium to form TiSix.

6. The method according to claim 1, wherein said forming a cobalt silicide layer comprises:
   forming a cobalt layer on the silicon substrate;
   forming a cap layer on the cobalt layer to form a layered structure;
   subjecting the layered structure to a heat treatment so that cobalt in the cobalt layer and silicon in the silicon substrate react to form a cobalt silicide layer on the silicon substrate while a part of the cobalt layer remains as an un-reacted portion of the cobalt layer; and
   removing the cap layer and the un-reacted portion of the cobalt layer.

7. The method according to claim 6, wherein the cobalt layer and the cap layer are formed by sputtering.

8. The method according to claim 6, wherein the cap layer is a titanium nitride layer.

9. A method of forming a titanium film, comprising:
   providing a silicon substrate;
   forming a cobalt silicide layer on the silicon substrate;
   introducing an element which reacts with titanium into the cobalt silicide layer; and
   forming a titanium film on the cobalt silicide layer using a titanium tetrachloride gas as a source gas, wherein the element reacts with titanium to form a titanium compound.

10. The method according to claim 9, wherein the element is boron.

11. The method according to claim 10, wherein the titanium compound is TiBx.

12. The method according to claim 9, wherein the element is silicon.

13. The method according to claim 12, wherein the titanium compound is TiSix.

14. The method according to claim 9, wherein said forming a cobalt silicide layer comprises:
   forming a cobalt layer on the silicon substrate;
   forming a cap layer on the cobalt layer to form a layered structure;
   subjecting the layered structure to a heat treatment so that cobalt in the cobalt layer and silicon in the silicon substrate react to form a cobalt silicide layer on the silicon substrate while a part of the cobalt layer remains as an un-reacted portion of the cobalt layer; and
   removing the cap layer and the un-reacted portion of the cobalt layer.

15. The method according to claim 14, wherein the cobalt layer and the cap layer are formed by sputtering.

16. The method according to claim 14, wherein the cap layer is a titanium nitride layer.

17. A method of forming a contact structure comprising:
providing a silicon substrate;
forming a cobalt silicide layer on the silicon substrate;
introducing an element which reacts with titanium into the cobalt silicide layer;
forming a titanium film on the cobalt silicide layer using a titanium tetrachloride gas as a source gas, wherein the element reacts with titanium to form a titanium compound;
subjecting the titanium film to a heat treatment in a nitride atmosphere so as to form a titanium nitride layer on a surface of the titanium film; and
forming a metal layer on the titanium nitride layer.

18. The method according to claim 17, wherein the element is boron.

19. The method according to claim 18, wherein the boron reacts with titanium to form $TiB_x$.

20. The method according to claim 17, wherein the element is silicon.

21. The method according to claim 20, wherein the silicon reacts with titanium to form $TiSi_x$.

22. The method according to claim 17, wherein said forming a cobalt silicide layer comprises:
forming a cobalt layer on the silicon substrate;
forming a cap layer on the cobalt layer to form a layered structure;
subjecting the layered structure to a heat treatment so that cobalt in the cobalt layer and silicon in the silicon substrate react to form a cobalt silicide layer on the silicon substrate while a part of the cobalt layer remains as an un-reacted portion of the cobalt layer; and
removing the cap layer and the un-reacted portion of the cobalt layer.

23. The method according to claim 22, wherein the cobalt layer and the cap layer are formed by sputtering.

24. The method according to claim 22, wherein the cap layer is a titanium nitride layer.

25. The method according to claim 17, wherein the metal layer is a tungsten layer.

* * * * *